(12) United States Patent
Rhodes (10) Patent No.: US 6,967,121 B2
(45) Date of Patent: Nov. 22, 2005

(54) BURIED CHANNEL CMOS IMAGER AND METHOD OF FORMING SAME

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/642,612

(22) Filed: Aug. 19, 2003

(65) Prior Publication Data

US 2004/0053436 A1    Mar. 18, 2004

Related U.S. Application Data

(62) Division of application No. 09/374,988, filed on Aug. 16, 1999, now Pat. No. 6,630,701.

(51) Int. Cl.[7] .............................................. H01L 21/00
(52) U.S. Cl. ..................... 438/73; 438/200; 438/231; 438/526
(58) Field of Search ................... 438/57–99, 510–532, 438/199–233

(56) References Cited

U.S. PATENT DOCUMENTS

| | | | |
|---|---|---|---|
| 3,995,302 A | | 11/1976 | Amelio |
| 4,374,700 A | | 2/1983 | Scott et al. |
| 5,302,543 A | * | 4/1994 | Sakakibara ................. 438/146 |
| 5,319,604 A | | 6/1994 | Imondi et al. |
| 5,436,949 A | * | 7/1995 | Hasegawa et al. ............ 377/60 |
| 5,461,425 A | | 10/1995 | Fowler et al. |
| 5,471,515 A | | 11/1995 | Fossum et al. |
| 5,541,402 A | | 7/1996 | Ackland et al. |
| 5,576,763 A | | 11/1996 | Ackland et al. |
| 5,612,799 A | | 3/1997 | Yamazaki et al. |
| 5,614,744 A | | 3/1997 | Merrill |
| 5,625,210 A | | 4/1997 | Lee et al. |
| 5,705,846 A | | 1/1998 | Merrill |
| 5,708,263 A | | 1/1998 | Wong |
| 5,739,562 A | | 4/1998 | Ackland et al. |
| 5,757,045 A | | 5/1998 | Tsai et al. |
| 5,818,075 A | * | 10/1998 | Kawamoto et al. ......... 257/239 |
| 5,841,159 A | | 11/1998 | Lee et al. |
| 5,939,742 A | | 8/1999 | Yiannoulos |
| 6,051,857 A | | 4/2000 | Midda |
| 6,150,683 A | * | 11/2000 | Merrill et al. .............. 257/292 |
| 6,291,280 B1 | * | 9/2001 | Rhodes ....................... 438/199 |
| 6,331,873 B1 | * | 12/2001 | Burke et al. ................ 348/314 |
| 6,396,539 B1 | | 5/2002 | Heller et al. |
| 6,858,460 B2 | * | 2/2005 | Rhodes et al. ................ 438/60 |

OTHER PUBLICATIONS

*Fossum, E., "Low Power Camera-on-a-Chip Using CMOS Active Pixel Sensor Technology," 1995 IEEE, pps. 74-77.
*Fossum, E., "Architectures for Focal Plane Image Processing ," Optical Engineering, vol. 28, No. 8, Aug. 1989, pps. 865-871.
*Janesick, J., et al., "New advancements in charge-coupled device technology—sub-electron noise and 4096×4096 pixel CCDs," Proc. SPIE vol. 1242, 1990, pps. 223-237.

(Continued)

*Primary Examiner*—Savitri Mulpuri
(74) *Attorney, Agent, or Firm*—Dickstein Shapiro Morin & Oshinsky LLP (57) ABSTRACT

A buried channel CMOS imager having an improved signal to noise ratio is disclosed. The buried channel CMOS imager provides reduced noise by keeping collected charge away from the surface of the substrate, thereby improving charge loss to the substrate. The buried channel CMOS imager thus exhibits a better signal-to-noise ratio. Also disclosed are processes for forming the buried channel CMOS imager.

22 Claims, 9 Drawing Sheets

OTHER PUBLICATIONS

*Kemeny, S.E., et al., "Update on focal-plane image processing research," Proc. SPIE vol. 1447, 1991, pps. 243-250.

*Mendis, S., et al., "CMOS Active Pixel Image Sensor," IEEE Transactions on Electron Devices, vol. 41, No. 3, Mar. 1994, pps. 452-453.

*Mendis, S.K., et al., "A 128 × 128 CMOS Active Pixel Image Sensor for Highly Integrated Imaging Systems," 1993 IEEE, pps. 583-586.

*Mendis, S.K., et al., "CMOS Active Pixel Image Sensors for Highly Integrated Imaging Systems," IEEE Journal of Solid-State Circuits, vol. 32, No. 2, Feb. 1997, pps. 187-197.

*Mendis, S.K., et al., "Design of a Low-Light-Level Image Sensor with On-Chip Sigma-Delta Analog-to-Digital Conversion," Proc. SPIE vol. 1900, Jul. 1993, pps. 31-39.

*Mendis, S.K., et al., "Low-Light-Level Image Sensor with On-Chip Signal Processing," Proc. SPIE vol. 1952, Nov. 1993, pps. 23-33.

*Mendis, S.K., et al., "Progress In CMOS Active Pixel Image Sensors," Proc. SPIE vol. 2172, May 1994, pps. 19-29.

*Nakamura, J., et al., "CMOS Active Pixel Image Sensor with Simple Floating Gate Pixels," IEEE Transactions on Electron Devices, vol. 42, No. 9, Sep. 1995, pps. 1693-1694.

*Janesick, J., et al., "New advancements in charge-coupled device technology—sub-electron noise and 4096×4096 pixel CCDs," Proc. SPIE vol. 1242, 1990, pps. 223-237.

*Kemeny, S.E., et al., "Update on focal-plane image processing research," Proc. SPIE vol. 1447, 1991, pps. 243-250.

*Mendis, S., et al., "CMOS Active Pixel Image Sensor," IEEE Transactions on Electron Devices, vol. 41, No. 3, Mar. 1994, pps. 452-453.

*Mendis, S.K., et al., "A 128 × 128 CMOS Active Pixel Image Sensor for Highly Integrated Imaging Systems," 1993 IEEE, pps. 583-586.

*Mendis, S.K., et al., "CMOS Active Pixel Image Sensors for Highly Integrated Imaging Systems," IEEE Journal of Solid-State Circuits, vol. 32, No. 2, Feb. 1997, pps. 187-197.

*Mendis, S.K., et al., "Design of Low-Light-Level Image Sensor with On-Chip Sigma-Delta Analog-to-Digital Conversion," Proc. SPIE vol. 1900, Jul. 1993, pps. 31-39.

* Nixon, R.H., et al., "256 × 256 CMOS Active Pixel Sensor Camera-on-a-Chip," IEEE Journal of Solid-State Circuits, vol. 31, No. 12, Dec. 1996, pps. 2046-2050.

* Nixon, R.H., et al., "256×256 CMOS Active Pixel Sensor Camera-on-a-Chip," 1996 IEEE International Solid-State Circuits Conference, pps. 178-179.

* Panicacci, R., et al., "Programmable multiresolution CMOS active pixel sensor," Proc. SPIE vol. 2654, Mar. 1996, pps. 72-79.

* Panicacci, R.A., et al., "128Mb/s Multiport CMOS Binary Active-Pixel Image Sensor," 1996 IEEE International Solid-State Circuit Conference, pps. 100-101.

* Yadid-Pecht, O., et al., "CMOS Active Pixel Sensor Star Tracker with Regional Electronic Shutter," IEEE Journal of Solid-State Circuits, vol. 32, No. 2, Feb. 1997, pps. 285-288.

* Yadid-Pecht, O., et al., "Wide dynamic range APS star tracker," Proc. SPIE vol. 2654, Mar. 1996, pps. 82-92.

* Zarnowski, J., et al., "Imaging options expand with CMOS technology," Laser Focus World, Jun. 1997, pps. 125-130.

* Zhou, Z., et al., "A Cmos Imager with On-Chip Variable Resolution for Light-Adpative Imaging," 1998 IEEE International Solid-State Circuits Conference, pps. 174-175.

* Zhou, Z., et al., *A Digital CMOS Active Pixel Image Sensor For Multimedia Applications*, Proc. SPIE vol. 2894, Sep. 1996, pps. 282-288.

* cited by examiner

BURIED CHANNEL CMOS IMAGER AND METHOD OF FORMING SAME

CROSS REFERENCE TO RELATED APPLICATIONS

The present application is a divisional application of U.S. patent application Ser. No. 09/374,988, filed on Aug. 16, 1999 (now U.S. Pat. No. 6,630,701 issued on Oct. 7, 2003), the disclosure of which is herewith incorporated by reference in its entirety.

FIELD OF THE INVENTION

The invention relates generally to improved semiconductor imaging devices and in particular to an imaging device which can be fabricated using a standard CMOS process. Particularly, the invention relates to CMOS imagers having a buried channel which exhibit an improved signal to noise ratio.

BACKGROUND OF THE INVENTION

There are a number of different types of semiconductor-based imagers, including charge coupled devices (CCDs), photodiode arrays, charge injection devices and hybrid focal plane arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046–2050, 1996; Mendis et al, "CMOS Active Pixel Image Sensors," IEEE Transactions on Electron Devices, Vol. 41(3) pp. 452–453, 1994 as well as U.S. Pat. Nos. 5,708,263 and 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Figure 1:
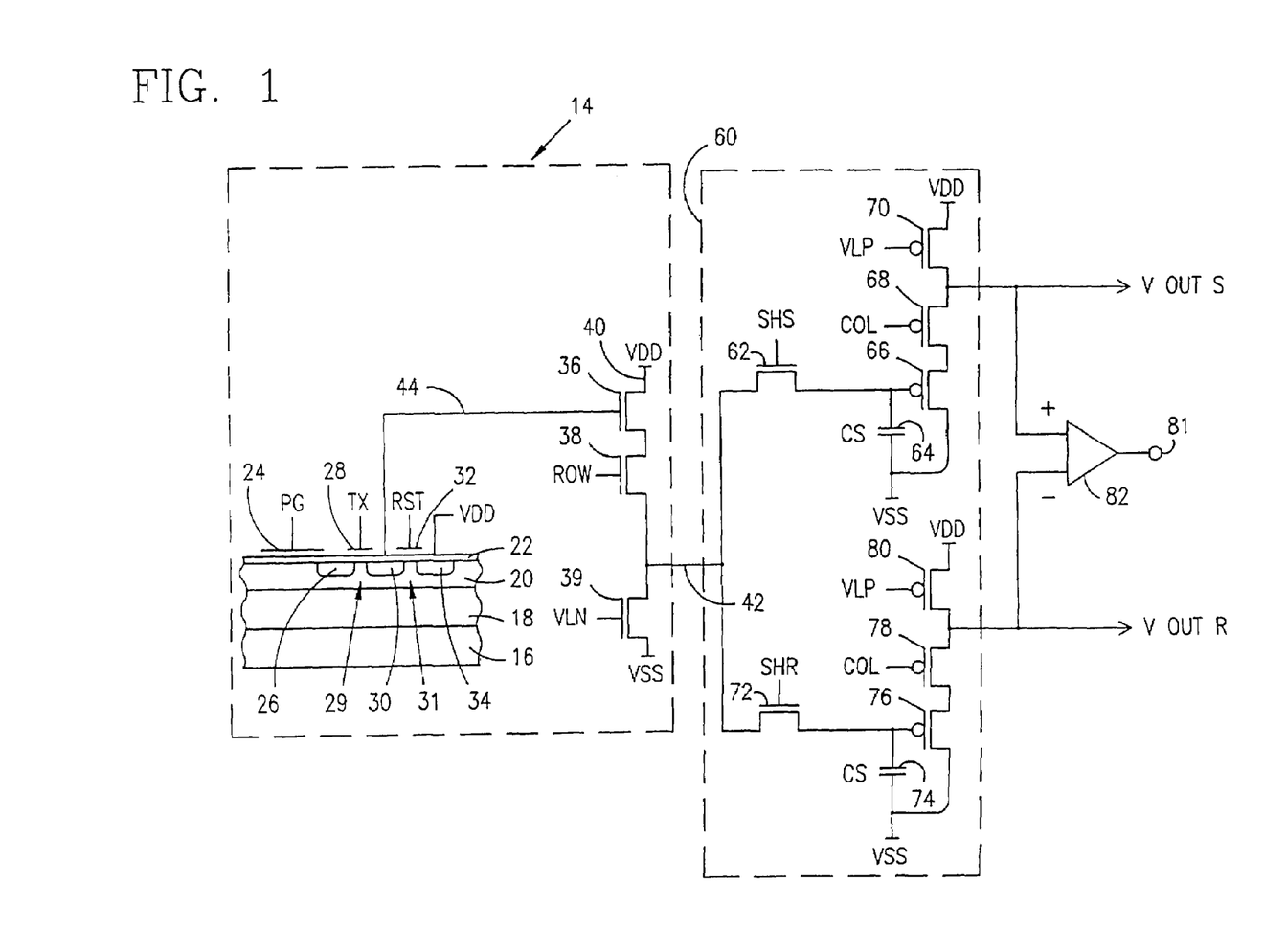
FIG. 1 is a representative circuit of a CMOS imager.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including , silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source VDD, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS, e.g. 0 volts.

Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS-VOUTR) by subtractor 82 to provide an output signal terminal 81 which is an image signal independent of pixel to pixel variations caused by fabrication variations in the reset voltage transistor 31 which might cause pixel to pixel variations in the output signal.

Figure 2:
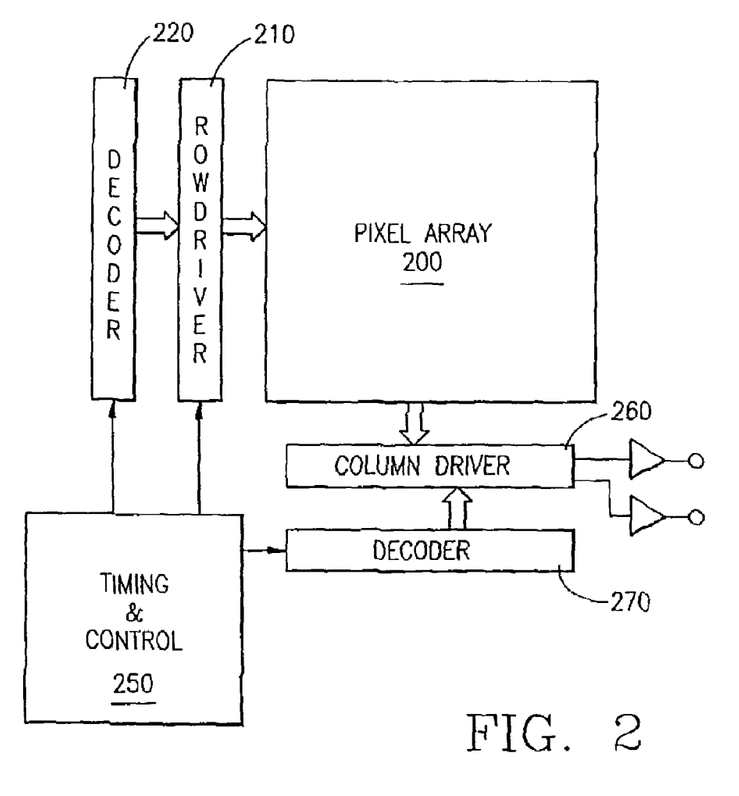
FIG. 2 is a block diagram of a CMOS active pixel sensor chip.
Figure 4:
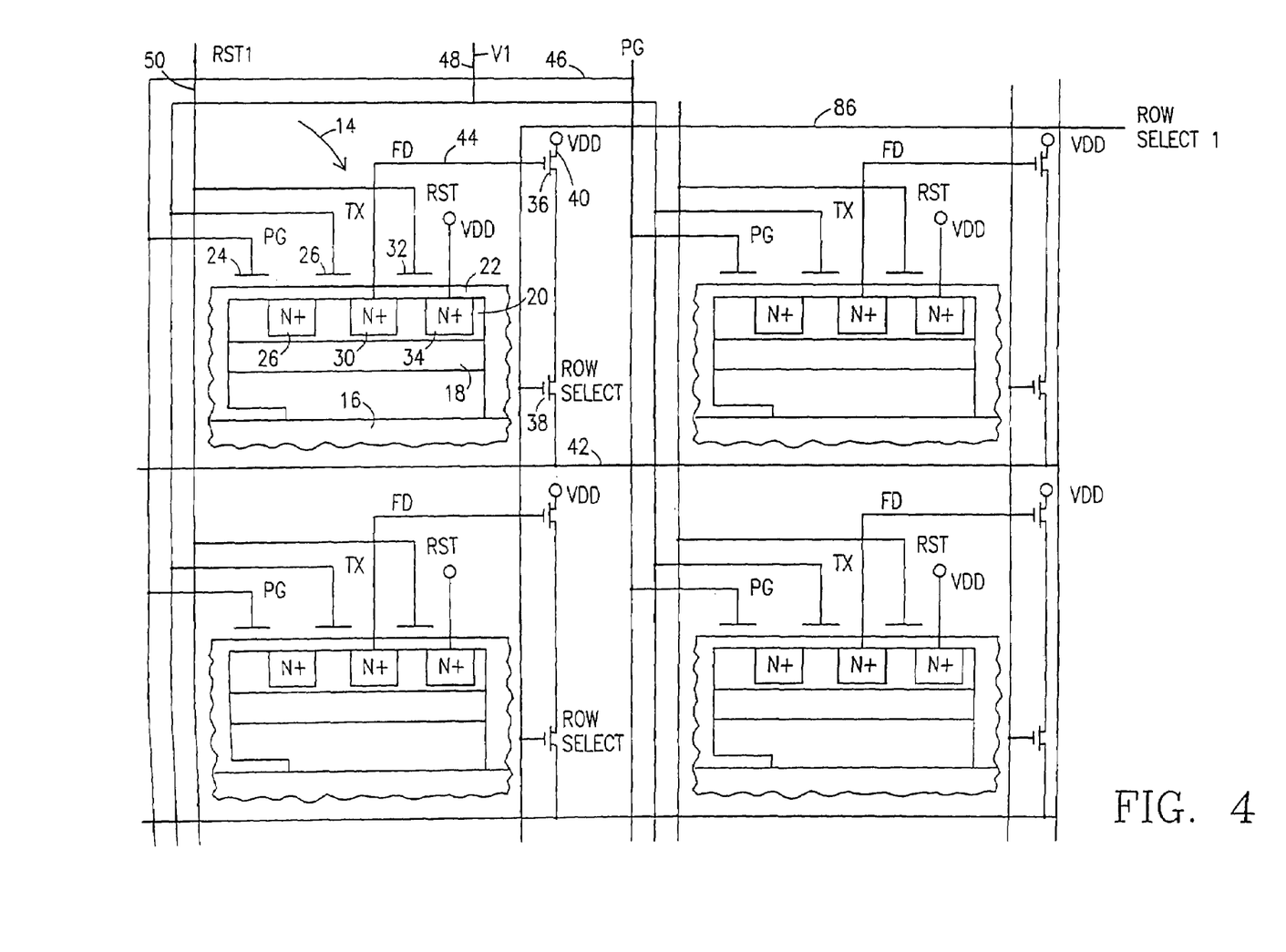
FIG. 4 is a representative pixel layout showing a 2×2 pixel layout according to one embodiment of the present invention.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns to and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

Figure 3:
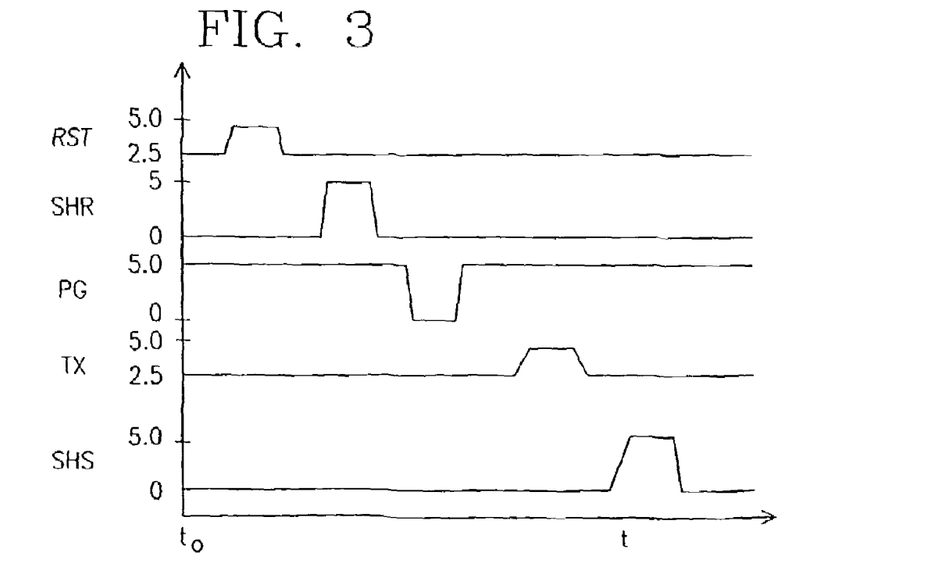
FIG. 3 is a representative timing diagram for the CMOS imager.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time to by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor Qutput voltage on line 42 representing the reset charge present at floating diffusion node 30. The PG signal is next pulsed to 0 volts, causing charge to be collected in n+ region 26. A transfer gate voltage TX, similar to the reset pulse RST, is then applied to transfer gate 28 of transistor 29 to cause the charge in n+region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17–25 (1995) as well as other publications. These references are incorporated herein by reference.

Prior CMOS imagers suffer from a poor signal to noise ratio as a result of noise created by the surface state of the silicon substrate attracting collected charge away from charge holding regions within the substrate. This signal to noise ratio is difficult to improve by signal processing techniques. Since the size of the pixel electrical signal is very small due to the collection of photons in the photo array, the signal to noise ratio of the pixel should be as high as possible within a pixel. Therefore, leakage of charge to the substrate surface should be minimized as much as possible. There is needed, therefore, an improved active pixel photosensor for use in an APS imager that exhibits reduced charge leakage to the substrate surface, a better signal-to-noise ratio and an improved dynamic range. A method of fabricating an active pixel photosensor having these properties is also needed.

SUMMARY OF THE INVENTION

The present invention provides a buried channel CMOS imager formed in a doped semiconductor substrate for use in an active pixel sensor cell. As used herein, the term buried channel refers to a doped region formed just below the surface of the CMOS semiconductor substrate which operates to reduce charge loss from charge transporting regions within an imager substrate to the surface of the substrate. The buried channel CMOS imager comprises a lightly doped region formed under the transistor gates of the CMOS imager. Also provided are methods for forming the buried channel CMOS imager of the present invention.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 5:
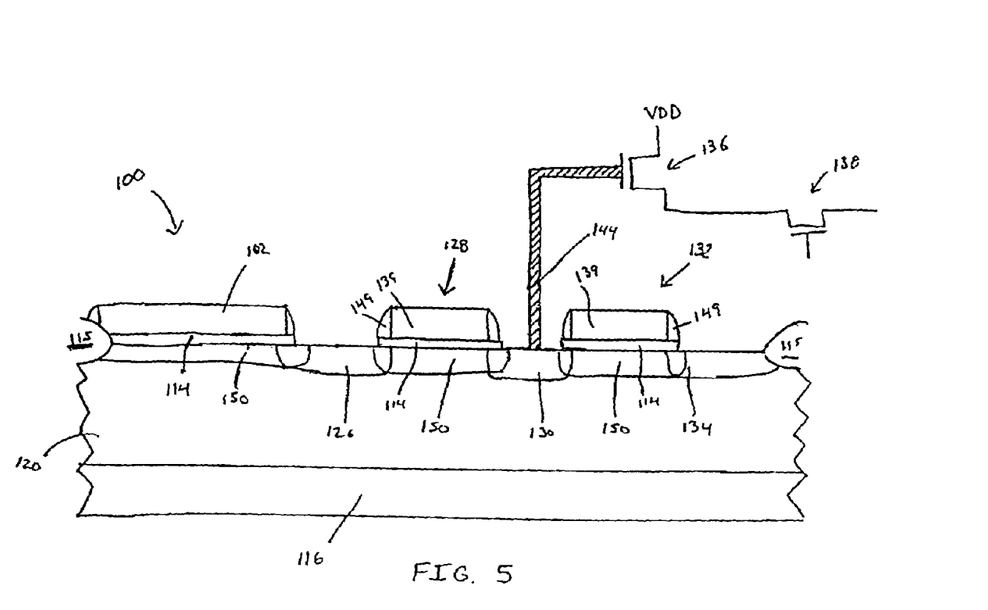
FIG. 5 is a cross-sectional view of a pixel sensor according to the present invention.

Reference is now made to FIG. 5 which illustrates the structure of the pixel cell 100 of the first embodiment. The pixel cell 100 may be formed on a substrate 116 having a doped layer 120 of a first conductivity type, which for exemplary purposes is treated as a p-well. A field oxide layer 115, which serves to surround and isolate the cells may be formed by thermal oxidation of the doped layer 120, or by chemical vapor deposition of an oxide material. The field oxide region 115 may be formed by thermal oxidation of the substrate using the LOCOS process or by the STI process which involves the chemical vapor deposition of an oxide material. P-well 120 is provided with three doped regions 126, 130, and 134, which are doped to a second conductivity type, which for exemplary purposes is treated as n-type. The first doped region 126 serves to electronically connect the photogate transistor 100 with the transfer gate transistor 128 and it underlies a portion of the photogate 102, which is a thin layer of material transparent to radiant energy, such as polysilicon. An insulating layer 114 of silicon dioxide, silicon nitride, or other suitable material is formed between the photogate 102 and doped region 150, and extends to the pixel-isolating field oxide region 115 and over a surface of p-well 120. A buried channel 150 provided within p-well 120 underlies the photogate 102, transfer transistor 128 and reset transistor 132 as shown in FIG. 5. It should be understood that the buried channel 150 may also be formed under any of the additional transistors on the substrate, such as, for example the source follower transistor 136. Additionally, it should be understood that while the buried channel 150 is depicted below the photogate 102, transfer transistor 128 and reset transistor 132 in FIG. 5 it may be optionally formed under any one of these or other transistors in the cell 100. Thus, under low light conditions the buried channel 150 may be placed under photogate 102 to improve collection in low light conditions by keeping collected energy away from the substrate surface. In conditions where energy collection by photogate is not a concern, buried channel 150 may be placed under selected array transistors to improve readout of charge collected in the photosensor.

The buried channel 150 is of a second conductivity, i.e., different from that of p-well 120, but of a similar conductivity to the three doped regions 126, 130 and 134, e.g. n-type. The buried channel 150 is doped to a dopant concentration which is less than three doped regions 126, 130 and 134, as explained below.

The second doped region 130 forms the floating diffusion region, sometimes also referred to as a floating diffusion node. The floating diffusion region 130 is connected to source follower transistor 136 by a diffusion contact line 144 which is typically a metal contact line. The source follower transistor 136 outputs the charge accumulated in region 126 via the floating diffusion region 130 and diffusion contact line 144 via transistors 136, 138 to a readout circuit as shown above in FIG. 1. While the source follower transistor 136 and transistor 138 are schematically illustrated in FIG. 5 as being above p-well 120, it should be understood that these transistors may also be formed in p-well 120 in a similar fashion to transistors 128 and 132. The third doped region 134 is the drain of the reset transistor 132, and is also connected to voltage source VDD. The pixel cell described with reference with FIG. 5 operates in a manner similar to the pixel cell described above with reference to FIGS. 1–4.

Figure 6:
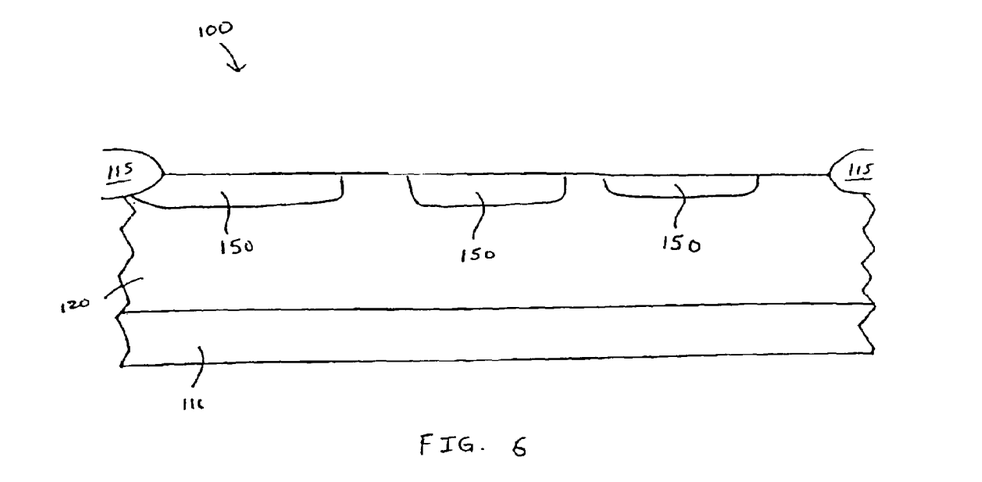
FIG. 6 is a cross-sectional view of a semiconductor wafer undergoing the process of a first embodiment of the present invention.

The buried channel CMOS imager of the invention is manufactured by a process described as follows, and illustrated by FIGS. 6 through 8. Referring now to FIG. 6, a substrate 116, which may be any of the types of substrates described above, is doped to form well 120 of a first conductivity type, which for exemplary purposes will be described as p-type, that is, well 120 is a p-well in this example.

Buried channel 150 is formed in p-well 120. Any suitable doping process may be used, such as ion implantation. A resist and mask (not shown) are used to shield areas of p-well 120 that are not to be doped. Three buried channel regions 150 may be formed in this step: a region which will reside under the photogate, a region which will reside under the transfer gate and a region which will reside under the reset gate as shown in FIG. 5. The buried channel 150 may also be formed under the source follower transistor 136 as described below. Additionally, while the buried channel 150 shown in FIG. 5 is illustrated as three separate regions, it should be understood that the buried region 150 may be formed by doping p-well 120 to form a continuous buried channel 150.

The buried channel 150 is doped to a second conductivity type, which for exemplary purposes will be considered to be n-type. The dopant concentration of the buried channel 150 may vary but should be greater than the dopant concentration of p-well 120 and less than the dopant concentration of the doped regions 126, 130 and 134. Preferably, the buried channel 150 are lightly n-doped with arsenic, antimony or phosphorous at a dopant concentration of from about $1\times10^{11}$ ions/cm$^3$ to about $1\times10^{13}$ ions/cm$^3$.

An oxide or other insulating layer 114 is grown or deposited on the substrate by conventional methods. Preferably the insulating layer 114 is formed of a silicon dioxide grown onto the substrate and has a thickness of from about 2 to 100 nm.

Figure 7:
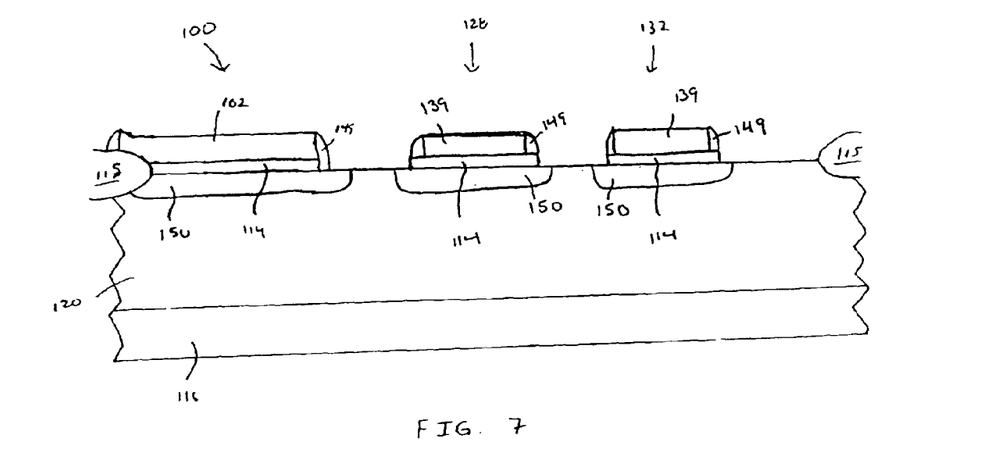
FIG. 7 shows the wafer of FIG. 6 at a processing step subsequent to that shown in FIG. 6.

Transfer transistor 128 and reset transistor 132 are formed by depositing a conductive gate layer 139 over the insulating layer 114 as shown in FIG. 7. A source follower transistor gate 136, and a reset transistor gate 128 are also formed over the insulating layer 114 at this stage of processing. The gate layers 139 of the transistors are preferably formed of doped polysilicon formed by physical deposition methods such as chemical vapor deposition (CVD) or physical vapor deposition. The photogate 102 may be formed of a doped polysilicon. The conductive photogate material is transparent to electromagnetic radiation of the wavelengths desired to be sensed. The thickness of the conductive layer 139 may be any suitable thickness, e.g., approximately 200 to 5000 Angstroms. If the conductive material is a silicon material, then conductive layer 139 will be formed by CVD or other suitable means. Alternatively, the photogate 102 may be formed in a separate processing step from when gates 128, 132 are formed.

The gate layers 139 may also be formed of a composite layered structure of doped polysilicon/refractory metal silicide, if desired, according to conventional methods if the photogate 102 and the gates 128, 132 are formed at separate process steps. Preferably the refractory metal silicide is a tungsten, titanium, tantalum or cobalt silicide.

The transfer gate 128, the reset gate 132, and the photogate 100 have sidewall insulating spacers 149 formed on the sides of the transistors 128, 132, and 100 as shown in FIG. 6. The spacers 149 are formed on the sides of the gate stacks 128, 132, 100. The spacers 149 may be formed of deposited insulation materials such as silicon oxide, silicon nitride, silicon oxynitride, or ONO or ON or NO. After deposition of the insulating material it is etched using an anisotropic dry etch that forms the sidewall spacers 149. This anisotropic etch may partially or completely remove the remaining first insulating layer 114. It should be understood that layers 114 and 139 can all be deposited on the substrate then etched to form gate stacks for transistors 128, 132, 100 after which insulating spacers 149 are formed. The spacers are preferably formed out of oxide or nitride or oxynitride.

Figure 8:
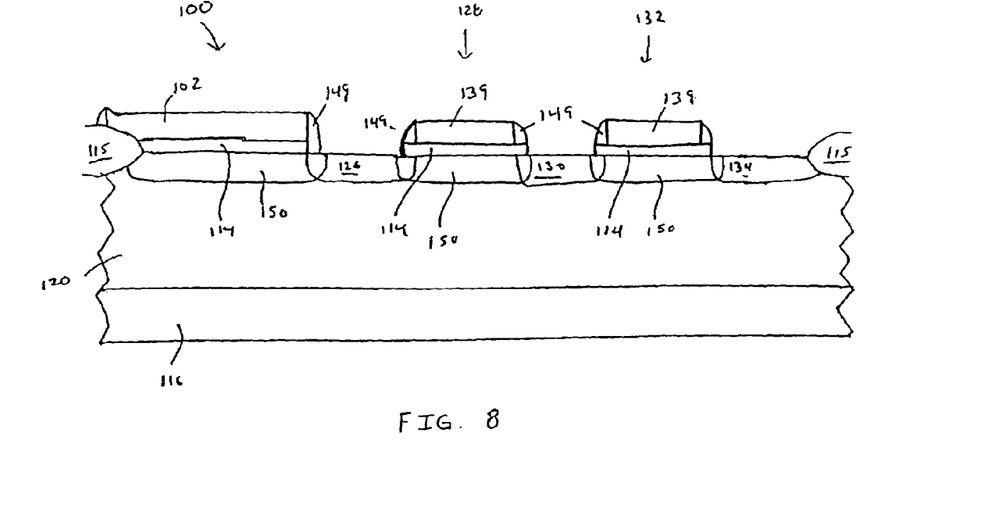
FIG. 8 shows the wafer of FIG. 6 at a processing step subsequent to that shown in FIG. 7.

Reference is now made to FIG. 8. Doped regions 126, 130 and 134 are then formed in p-well 120. Any suitable doping process may be used, such as ion implantation. A resist and mask (not shown) are used to shield areas of p-well 120 that are not to be doped. Three doped regions are formed in this step: the first doped region 126, which serves to electrically connect the photogate transistor 100 to the transfer gate 128; the second doped region which is floating diffusion region 130 (which connects to the source follower transistor 136 by contact 144 as shown in FIG. 5); and the third doped region which is a drain region 134. The doped regions 126, 130, 134 are doped to a second conductivity type, which for exemplary purposes will be considered to be n-type. The dopant concentration of the doped regions 126, 130, 134 may each be different. Preferably, the doped regions 126, 130 and 134 are heavily n-doped with arsenic, antimony of phosphorous at a dopant concentration of from about $1\times10^{14}$ ions/cm$^3$ to about $5\times10^{16}$ ions/cm$^3$. There may be other dopant implantat ions applied to the wafer at this stage of processing such as n-well and p-well implants or transistor voltage adjusting implants. For simplicity, these other implants are not shown in the figure.

For the pixel cell 100 of the first embodiment, the photosensor cell is essentially complete at this stage, and conventional processing methods may then be used to form contacts and wiring to connect gate lines and other connections in the pixel cell. For example, the entire surface may then be covered with a passivation layer of, e.g., silicon dioxide, BPSG, PSG, BSG or the like which is CMP planarized and etched to provide contacts, which are then metallized to provide contacts to the photogate, reset gate, and transfer gate. Conventional multiple layers of conductors and insulators may also be used to interconnect the structures in the manner shown in FIG. 1. By doping the subsurface of the semiconductor substrate at a light level in buried channel 150, the electrical charge is kept away from the surface by the buried channel 150 which keeps charge away from the surface due to the light doping of the buried channel where the lowest signal levels are sensitive to noise to be sensed.

Figure 9:
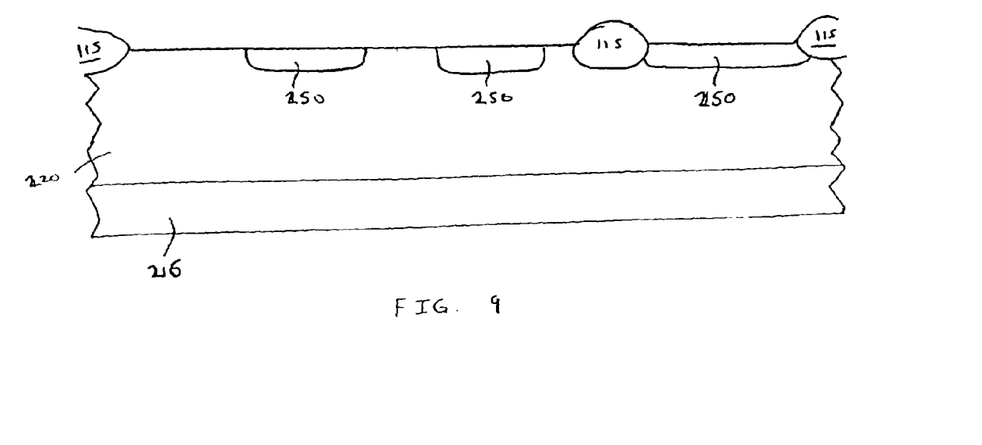
FIG. 9 is a cross-sectional view of a semiconductor wafer undergoing the process of a second embodiment of the present invention.
Figure 10:
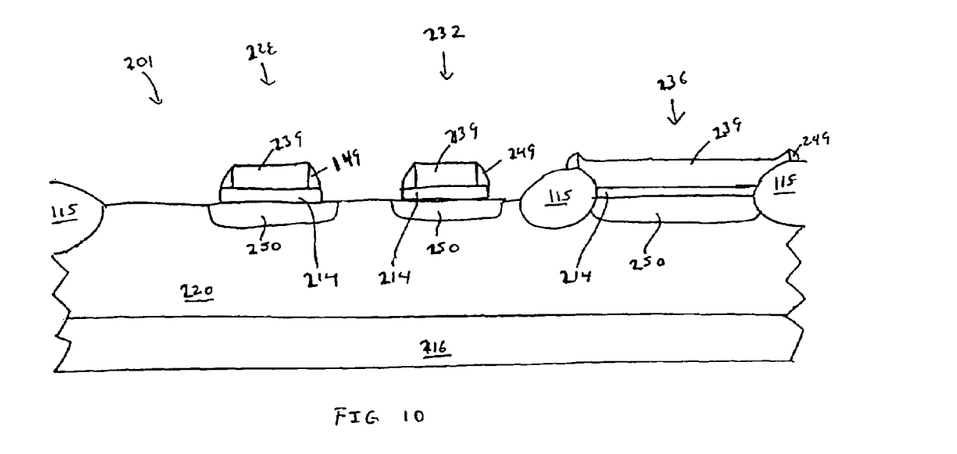
FIG. 10 shows the wafer of FIG. 9 at a processing step subsequent to that shown in FIG. 9.
Figure 11:
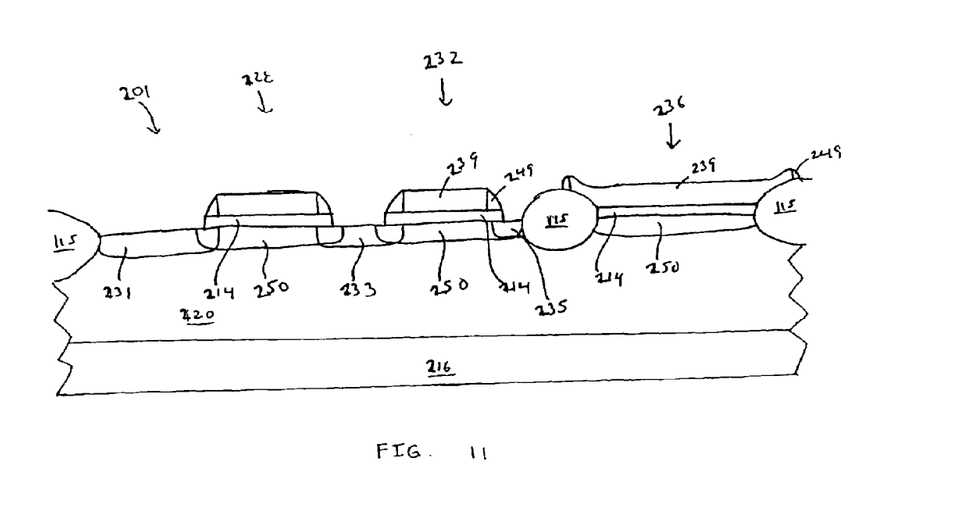
FIG. 11 shows the wafer of FIG. 9 at a processing step subsequent to that shown in FIG. 10.

An alternative embodiment of the present invention is illustrated by FIGS. 9–11. FIG. 9 shows a partially cut away cross-sectional view of a CMOS semiconductor wafer similar to that shown in FIG. 1. It should be understood that similar reference numbers correspond to similar elements for FIGS. 5–11. FIG. 9 shows the region between the floating diffusion and the source follower transistor for an imager having a photodiode as the photosensitive area and which includes a transfer gate. The source follower transistor source and drain regions are in a plane perpendicular to FIG. 9.

Referring now to FIG. 9, a substrate 216, which may be any of the types of substrates described above, is doped to form well 220 of a first conductivity type, which for exemplary purposes will be described as p-type, thatis, well 220 is a p-well in this example. A buried channel 250 is formed in p-well 220. Any suitable doping process may be used, such as ion implantation. A resist and mask (not shown) are used to shield areas of p-well 220 that are not to be doped. Three buried channel regions 250 may be formed in this step: a region which will reside under the transfer gate and a region which will reside under the reset gate and a region that will reside under the source follower gate 236. The buried channel 250 is doped to a second conductivity type, which for exemplary purposes will be considered to be n-type. The dopant concentration of the buried channel 250 may vary but should be greater than the dopant concentration of the doped layer 220 and less than the dopant concentration of the doped regions 231, 233 and 235. Preferably, the buried channel 250 are lightly n-doped with arsenic, antimony or phosphorous at a dopant concentration of from about $1\times10^{11}$ ions/cm$^3$ to about $1\times10^{13}$ ions/cm$^3$.

Reference is now made to FIG. 10. The pixel cell 201 includes an oxide or other insulating layer 214 deposited on the substrate by conventional methods. Preferably the insulating layer 214 is formed of a silicon dioxide grown onto the substrate and has a thickness of from about 2 to 100 nm.

A transfer transistor 228, reset transistor 232 and source follower transistor 236 are formed by depositing a conductive gate layer 239 over the insulating layer 214 as shown in FIG. 10. The gate layers 239 of the transistors are preferably formed of doped polysilicon formed by physical deposition methods such as chemical vapor deposition (CVD) or physical vapor deposition. The gate layers 239 may also be formed of a composite layered structure of doped polysilicon/refractory metal silicide, if desired, according to conventional methods. Preferably the refractory metal silicide is a tungsten, titanium, tantalum or cobalt silicide. The gate layers 239 may also be formed of a composite layered structure of doped polysilicons barrier/metal where the barrier is, for example, Tin or WNx and the metal is W or WNx.

The transfer gate 228, the source follower gate 236, and the reset gate 232 have sidewall insulating spacers 249 formed on the sides of the transistors 236, 228, 232 as shown in FIG. 10. The spacers may be formed out of oxide or nitride or oxynitride as set forth in more detail above.

Reference is now made to FIG. 11. Doped regions 231, 233 and 235 are then formed on p-well 220. Any suitable doping process may be used, such as ion implantation. A resist and mask (not shown) are used to shield areas of p-well 220 that are not to be doped. The doped regions 231, 233, 235 are doped to a second conductivity type, which for exemplary purposes will be considered to be n-type. The dopant concentration of the doped regions 231, 233, 235 may vary but should be greater than the dopant concentration of the doped layer 220. Preferably, the doped regions 233 and 235 are heavily n-doped with arsenic, antimony of phosphorous at a dopant concentration of from about $1 \times 10^{14}$ ions/cm$^3$ to about $5 \times 10^{16}$ ions/cm$^3$. The doped region 231 may be lighty doped or heavily doped similar to regions 233, 235. There may be other dopant implantations applied to the wafer at this stage of processing such transistor voltage adjusting implants. For simplicity, these other implants are not shown in the figure.

For the pixel cell of the second embodiment, the photosensor cell is essentially complete at this stage, and conventional processing methods may then be used to form contacts and wiring to connect gate lines and other connections in the pixel cell. For example, the entire surface may then be covered with a passivation layer of, e.g., silicon dioxide, BPSG, PSG, BSG or the like which is CMP planarized and etched to provide contacts, which are then metallized to provide contacts to the photogate, reset gate, and transfer gate. Conventional multiple layers of conductors and insulators may also be used to interconnect the structures in the manner shown in FIG. 1.

Figure 12A:
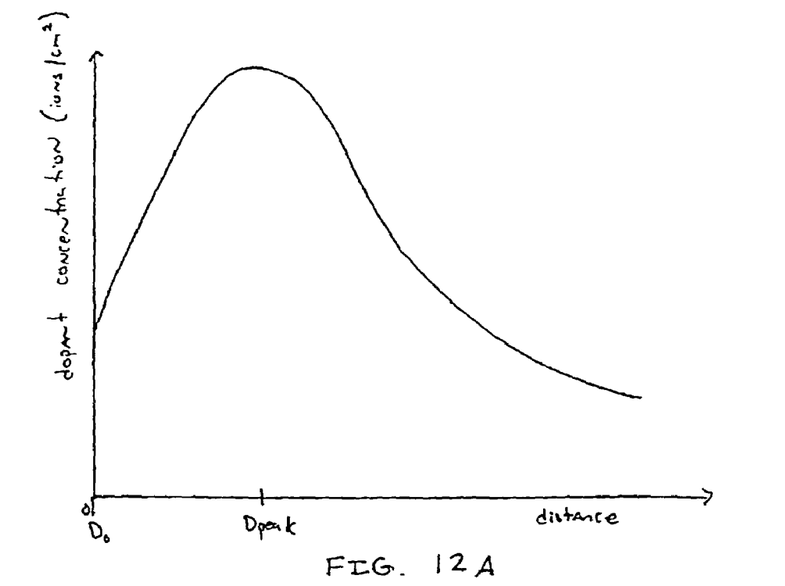
FIGS. 12A and 12B show the dopant concentration versus concentration and the corresponding electrical potential versus distance for the CMOS imager according to the present invention.
Figure 12B:
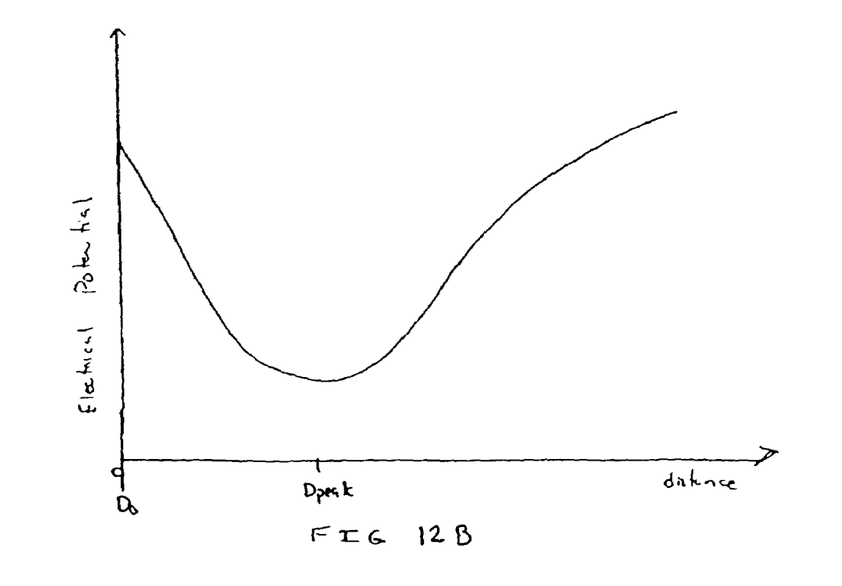

Reference is now made to FIGS. 12A and 12B. FIG. 12A shows the dopant concentration versus distance into the substrate of the dopant in a photocollection area for the CMOS imager of the present invention. FIG. 12B shows the corresponding electrical potential versus distance for the CMOS imager of the present invention. As can be seen from FIGS. 12A, 12B, by doping the subsurface of the semiconductor substrate to form buried channel 150, 250, the electrical charge is kept away from the surface $D_0$, where the lowest signal levels are more sensitive to surface noise, to area $D_{peak}$ the peak dopant concentration of buried channel 150, 250. As can be seen from FIG. 12B, the electrical potential at the surface of the device is improved, allowing charge to be collected in the doped well at area $D_{peak}$ limiting loss to the substrate surface. Thus, the buried channel in the CMOS imager eliminates surface noise component of the imager as the charge is stored in the doped well $D_{peak}$ and not at the surface of the doped region, $D_0$.

Figure 13:
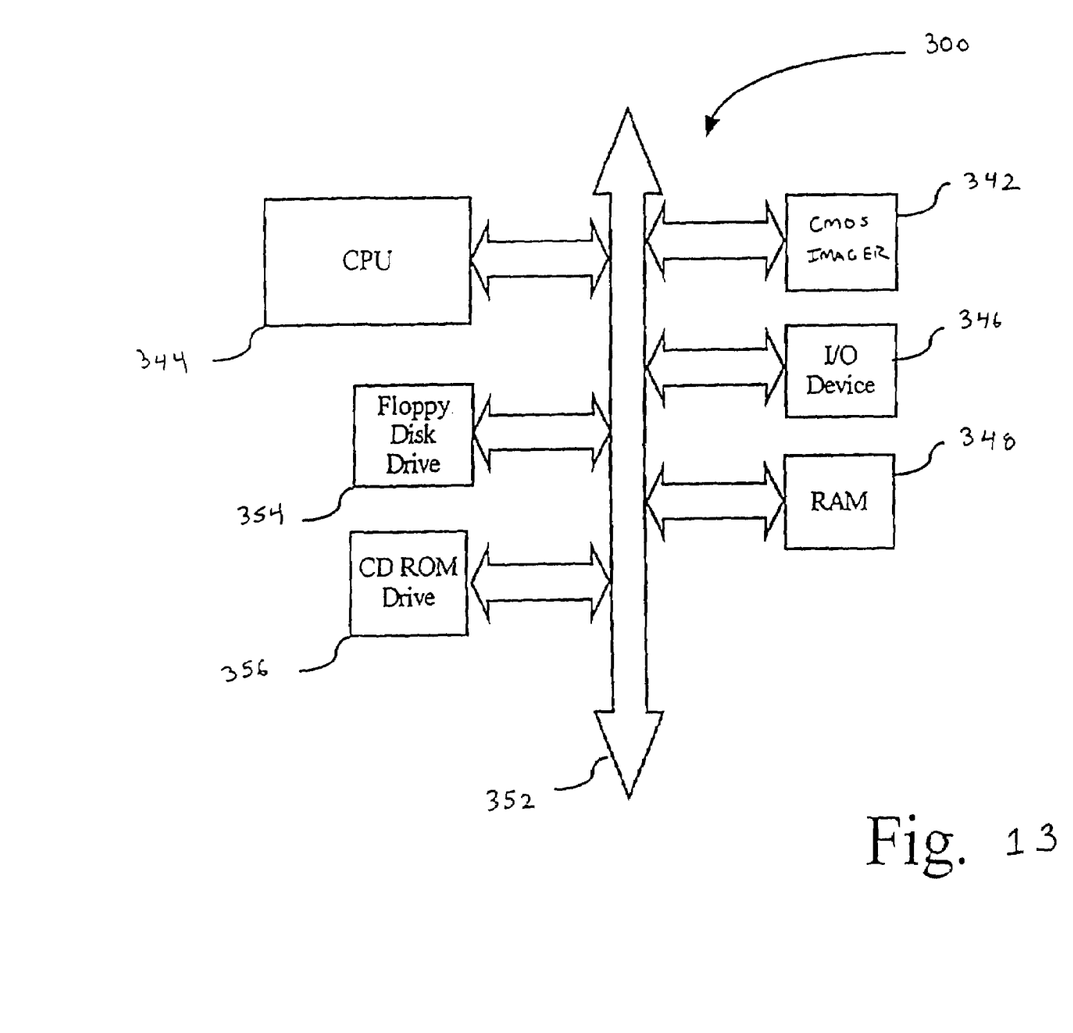
FIG. 13 is an illustration of a computer system having a CMOS imager according to the present invention.

A typical processor based system which includes a CMOS imager device according to the present invention is illustrated generally at 300 in FIG. 13. A processor based system is exemplary of a system having digital circuits which could include CMOS imager devices. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 344, for example, a microprocessor, that communicates with an input/output (I/O) device 346 over a bus 352. The CMOS imager 342 also communicates with the system over bus 352. The computer system 300 also includes random access memory (RAM) 348, and, in the case of a computer system may include peripheral devices such as a floppy disk drive 354 and a compact disk (CD) ROM drive 356 which also communicate with CPU 344 over the bus 352. CMOS imager 342 is preferably constructed as an integrated circuit which includes the CMOS imager having a buried contact line between the floating diffusion region and the source follower transistor, as previously described with respect to FIGS. 5–11. It may also be desirable to integrate the processor 354, CMOS imager 342 and memory 348 on a single IC chip.

It should again be noted that although the invention has been described with specific reference to CMOS imaging circuits having a photogate and a floating diffusion, the invention has broader applicability and may be used in any CMOS imaging apparatus. For example, the CMOS imager array can be formed on a single chip together with the logic or the logic and array may be formed on separate IC chips. Additionally, while the figures describe the invention with respect to a photodiode type of CMOS imager, any type of photocollection devices such as photogates, photoconductors or the like may find use in the present invention. Similarly, the process described above are but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed is:

1. A method of forming an imaging device, comprising the steps of:
    providing a semiconductor substrate having a doped layer of a first conductivity type;
    forming a first doped region of a second conductivity type in the doped layer;
    forming a second doped region of said second conductivity type in the doped layer spaced from said first doped region;
    forming a third doped region of said second conductivity type in the doped layer spaced from said second doped region;
    forming a buried doped region of said second conductivity type in said doped layer adjacent said first and second doped regions and adjacent said second and third doped regions, wherein said buried doped region is doped at a dopant concentration less than said first, second and third doped regions;
    forming a photogate over said buried doped region adjacent said first doped region;
    forming a transfer gate over said buried doped region between said second and said third doped regions;
    forming a contact between said second doped region and a source follower transistor wherein the gate of said source follower transistor is formed over said buried doped region.

2. The method according to claim 1, wherein the first conductivity type is p-type, and the second conductivity type is n-type.

3. The method according to claim 1, wherein said first doped region, said second doped region and said third doped region are formed by ion implantation.

4. The method according to claim 3, wherein said first doped region, said second doped region and said third doped region are doped with dopants selected from the group consisting of arsenic, antimony and phosphorous.

5. The method according to claim 4, wherein the dopant is phosphorus.

6. The method according to claim 4, wherein said first doped region, said second doped region and said third doped region are doped at a dopant concentration of from about $1 \times 10^{14}$ ions/cm$^3$ to about $5 \times 10^{16}$ ions/cm$^3$.

7. The method according to claim 1, wherein said buried doped region is formed by ion implantation.

8. The method according to claim 1, wherein said buried doped region is formed under the entire surface of said doped layer.

9. The method according to claim 1, wherein said buried doped region is doped with dopants selected from the group consisting of arsenic, antimony and phosphorous.

10. The method according to claim 9, wherein said dopant is phosphorous.

11. The method according to claim 9, wherein said buried doped region is doped at a dopant concentration of from about $1\times10^{11}$ ions/cm$^3$ to about $1\times10^{13}$ ions/cm$^3$.

12. A method of forming an imaging device, comprising the steps of:
provide a semiconductor substrate having a doped layer of a first conductivity type;
forming a first doped region of a second conductivity type in the doped layer;
forming a second doped region of said second conductivity type in the doped layer spaced from said first doped region;
forming a third doped region of said second conductivity type in the doped layer spaced from said second doped region;
forming a photogate over said first doped region;
forming a transfer gate over said second and said third doped regions;
forming a contact between said second doped region and a source follower transistor wherein the gate of said source follower transistor is over said substrate;
forming a buried doped region of said second conductivity type in said doped layer adjacent said first and second doped regions and adjacent said second and third doped regions and under said photogate, transfer gate and said source follower transistor gate, wherein said buried doped region is doped at a dopant concentration less than said first, second and third doped regions.

13. The method according to claim 12, wherein the first conductivity type is p-type, and the second conductivity type is n-type.

14. The method according to claim 12, wherein said first doped region, said second doped region and said third doped region are formed by ion implantation.

15. The method according to claim 14, wherein said first doped region, said second doped region and said third doped region are doped with dopants selected from the group consisting of arsenic, antimony and phosphorous.

16. The method according to claim 15, wherein the dopant is phosphorus.

17. The method according to claim 15, wherein said first doped region, said second doped region and said third doped region are doped at a dopant concentration of from about $1\times10^{14}$ ions/cm$^3$ to about $5\times10^{16}$ ions/cm$^3$.

18. The method according to claim 12, wherein said buried doped region is formed by ion implantation.

19. The method according to claim 12, wherein said buried doped region is formed under the entire surface of said doped layer.

20. The method according to claim 12, wherein said buried doped region is doped with dopants selected from the group consisting of arsenic, antimony and phosphorous.

21. The method according to claim 20, wherein said dopant is phosphorous.

22. The method according to claim 20, wherein said buried doped region is doped at a dopant concentration of from about $1\times10^{11}$ ions/cm$^3$ to about $1\times10^{13}$ ions/cm$^3$.

* * * * *

UNITED STATES PATENT AND TRADEMARK OFFICE
CERTIFICATE OF CORRECTION

PATENT NO. : 6,967,121 B2
DATED : November 22, 2005
INVENTOR(S) : Howard E. Rhodes It is certified that error appears in the above-identified patent and that said Letters Patent is hereby corrected as shown below:

Column 2,
Line 64, "haying" should read -- having --;

Column 4,
Line 55, "columns to and rows" should read -- columns and rows --;

Column 5,
Line 9, "to" should read -- $t_o$ --;
Line 23, "Qutput" should read -- output --;

Column 9,
Line 67, "noise" should read -- noise. --; and

Column 10,
Line 15, "thatis" should read -- that is --.

Signed and Sealed this

Twenty-eighth Day of March, 2006

JON W. DUDAS
*Director of the United States Patent and Trademark Office*